United States Patent [19]

Harada

[11] Patent Number: 5,547,886
[45] Date of Patent: Aug. 20, 1996

[54] METHOD OF PRODUCING A SEMICONDUCTOR DEVICE

[75] Inventor: Masana Harada, Itami, Japan

[73] Assignee: Mitsubishi Denki Kabushiki Kaisha, Tokyo, Japan

[21] Appl. No.: 350,414

[22] Filed: Dec. 6, 1994

Related U.S. Application Data

[62] Division of Ser. No. 904,666, Jun. 26, 1992, abandoned.

[30] Foreign Application Priority Data

Jul. 11, 1991 [JP] Japan .................... 3-170872

[51] Int. Cl.$^6$ ............................... H01L 21/70
[52] U.S. Cl. .................. 437/51; 437/34; 437/59; 437/62; 437/974; 148/DIG. 126; 148/DIG. 135
[58] Field of Search ................ 437/34, 51, 55, 437/59, 62, 63, 6, 974; 148/DIG. 126, DIG. 135

[56] References Cited

U.S. PATENT DOCUMENTS

| | | | |
|---|---|---|---|
| 4,570,330 | 2/1986 | Cogan | 437/62 |
| 4,908,328 | 3/1990 | Hu et al. | 437/63 |
| 4,948,748 | 8/1990 | Kitahara et al. | 437/62 |
| 4,963,505 | 10/1990 | Fuji et al. | 437/62 |
| 5,166,082 | 11/1992 | Nakamura et al. | 437/59 |
| 5,223,450 | 6/1993 | Fujino et al. | 437/62 |

OTHER PUBLICATIONS

IBM Technical Disclosure Bulletin, vol. 27, No. 12, May 1985, pp. 6968–6970, "CMOS Semiconductor Structure Without Latch–Up and Method of Fabrication Therefore".

*Primary Examiner*—Tuan H. Nguyen
*Attorney, Agent, or Firm*—Oblon, Spivak, McClelland, Maier & Neustadt, P.C.

[57] ABSTRACT

In an SOI substrate including a single-crystal Si substrate (1b), an oxide film (20) and a single-crystal Si substrate (1a), there is formed an stepped wall surface (8) by selective removal of the single-crystal Si substrate (1a) to provide a thick oxide film (5) on the stepped wall surface (8). When a VDMOS (100) is formed in an active region of the single-crystal Si substrate (1b) above which the single-crystal Si substrate (1a) is absent and an MOS (101) having a thin oxide film (22) is formed in the single-crystal Si substrate (1a), the oxide film (5) is not damaged because it is thick. The thickness of the single-crystal Si substrate (1a) enables to be designed in accordance with the required thickness of the MOS (101).

14 Claims, 8 Drawing Sheets

F I G. 1
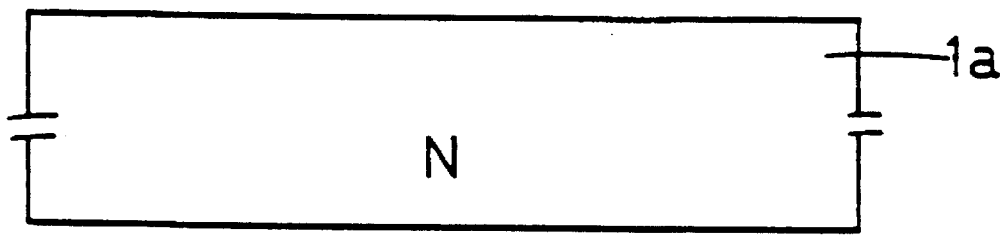
F I G. 2
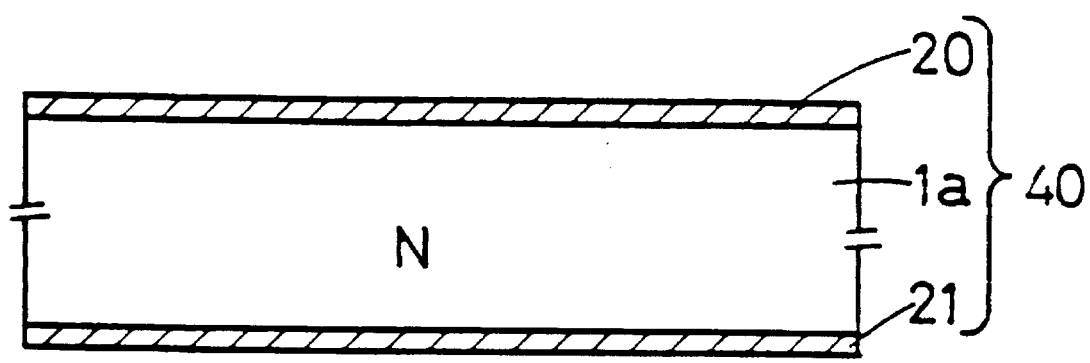

METHOD OF PRODUCING A SEMICONDUCTOR DEVICE

This is a Division of application Ser. No. 07/904,666 filed on Jun. 26, 1992, now abandoned.

BACKGROUND OF THE INVENTION

1. Field of the Invention

The present invention relates to a semiconductor device and a method of producing the same. More particularly, it relates to a power IC having a vertical power device for output and a method of producing the same.

2. Description of the Background Art

FIG. 15 is a cross-sectional view of a conventional power IC having a vertical power device 102 in accordance with junction isolation technique. The vertical power device is a device for electric power, in which current flows in the direction of the thickness of its substrate. N-type impurities are diffused on a surface of an N⁻ single-crystal substrate 1b which is shown in FIG. 15 as the bottom surface thereof to form an N⁺ layer 11b. A surface of the N³¹ single-crystal substrate 1b which is shown in FIG. 15 as the top surface thereof is selectively etched away deeply. P-type impurities are diffused on the inside faces of hollows which are formed by etching to form junction isolation regions 7. After the junction isolation regions 7 are filled with thick N-type epitaxial layers 1a, the etched surfaces are ground.

A drive circuit 103 and a logic circuit 104 are formed in the N-type epitaxial layers 1a. The power device 102 such as VDMOS is formed in the substrate 1b. In FIG. 15, S designates a source, G designates a gate, D designates a drain and 6 designates an electrode.

FIG. 16 is a cross-sectional view of a conventional power IC having a vertical power device 105 in accordance with dielectric isolation technique. Deep V-shaped grooves 11a are cut from the bottom surface of a single-crystal substrate 1a. After N-type impurities are diffused over the bottom surface, an isolation oxide film 20 is formed. The isolation oxide film 20 is selectively removed as shown in FIG. 16, and an N⁺ epitaxial layer of high concentration is formed thick. Part of the N⁺ epitaxial layer which is grown on the isolation oxide film 20 serves as a polysilicon layer 12, and part of the N epitaxial layer which is grown on a portion from which the isolation oxide film 20 is removed serves as an N⁺ layer 1c.

Subsequently, the single-crystal substrate 1a is cut and ground from the top surface until the single-crystal substrate 1a is completely separated into islands by the isolation oxide film 20. Thus the vertical power device 105, a drive circuit 106 and a logic circuit 107 are formed respectively in the regions separated by the isolation oxide film 20 serving as a dielectric, as shown in FIG. 16.

Since the conventional power ICs shown in FIGS. 15 and 16 include the vertical power devices 102 and 105 therein respectively, an output current flows from the top surface to the bottom surface of the wafer in FIGS. 15 and 16. Thus the current path lies in the direction of the thickness of the substrate. This provides for a reduced thermal resistance and a large current flow. Particularly in FIG. 15, the substrate 1b is a single crystal so that a larger current flow is permitted. The substrate 1b and N⁺ layer 1c which are a body region can be formed thick. Particularly in FIG. 16, the thick formation and dielectric isolation enable an increased breakdown voltage.

In FIG. 15, however, since the devices are separated by junction isolation, there arises a problem that the drive circuit 103 and logic circuit 104 are low in isolation breakdown voltage and increase in capacitance has a limit when the portion of the junction isolation is made thick for increasing the breakdown voltage.

In FIG. 16, it is necessary to cut the V-shaped grooves 11a deeply for increasing the breakdown voltage. There is a problem that the drive circuit 106 and logic circuit 107 are inevitably to be formed unnecessarily thick because of the production procedure of the V-shaped grooves 11a. Another problem is deterioration in breakdown voltage due to inner defects of the N+ layer 1c serving as an epitaxial layer.

SUMMARY OF THE INVENTION

According to the present invention, a semiconductor device comprises a first single-crystal layer having first and second major surfaces; first and second regions into which the first major surface is divided; a first insulative layer provided at least on the first region; a second single-crystal layer provided selectively above the first region through the first insulative layer and having a stepped wall surface above a boundary between the first and second regions; a relatively thick insulative wall provided on the stepped wall surface; a peripheral circuit provided in the second single-crystal layer and having a relatively thin second insulative layer; and a vertical power device provided in the second region.

In the semiconductor device according to the present invention, the vertical power device is formed in the first single-crystal layer, while the peripheral circuit is formed in the second single-crystal layer. The peripheral circuit and vertical power device are separated from each other by the insulative wall which is thick as compared with the second insulative layer included in the peripheral circuit. This provides the semiconductor device which is capable of designing the peripheral circuit and power device individually such as reduction of the thickness of the peripheral circuit to a minimum, and which has the vertical power device of high breakdown voltage and of large capacitance.

The present invention is also directed to a method of producing a semiconductor device. According to the present invention, the method comprises the steps of (a) preparing a first single-crystal layer having a first major surface which is divided into first and second regions and a second major surface, and providing a first insulative layer at least on the first region, to provide a second single-crystal layer selectively above the first region through the first insulative layer, the second single-crystal layer having a stepped wall surface above a boundary between the first and second regions; (b) providing a relatively thick insulative wall on the stepped wall surface; (c) providing a vertical power device in the second region; and (d) providing in the second single-crystal layer a peripheral circuit having a relatively thin second insulative layer.

In this method, the insulative wall which is formed prior to the formation of the peripheral circuit and vertical power device is thick as compared with the second insulative layer included in the peripheral circuit. Therefore the semiconductor device of the present invention is stably produced without damage in the formation of the peripheral circuit and vertical power device.

Preferably, the step (a) includes the steps of preparing the second single-crystal layer having first and second major surfaces; forming a first oxide film on the first major surface of the second single-crystal layer; and bonding the second single-crystal layer to the first major surface of the first single-crystal layer through the first oxide film.

Preferably, the step (a) includes the steps of preparing a third single-crystal layer having first and second major surfaces; and conducting oxygen ion implantation to form an oxide film which separates the third single-crystal layer by the oxide film into a fourth single-crystal layer exposed on a side of the first major surface of the third single-crystal layer and a fifth single-crystal layer exposed on a side of the second major surface of the third single-crystal layer. The oxide film, the fourth and fifth single-crystal layers are in corresponding relation to the first insulative layer, the second and first single-crystal layers respectively.

An SOI (Semiconductor on Insulator) substrate is provided by bonding between the first and second single-crystal layers or by SIMOX (Separation by IMplanted OXygen) technique by means of the oxygen ion implantation. Therefore, there is provided a semiconductor device having the vertical power device of larger capacitance without the necessity of employing an epitaxial layer which has the problem of inner defects.

It is an object of the present invention to provide a semiconductor device which is capable of designing a peripheral circuit and a power device independently such as reduction of the thickness of the peripheral circuit to a minimum and which has a vertical power device of high breakdown voltage and of large capacitance, and a method of producing the same.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 shows a single-crystal silicon substrate of a first preferred embodiment according to the present invention;

FIG. 2 shows the step of oxidizing the single-crystal silicon of FIG. 1;

DESCRIPTION OF THE PREFERRED EMBODIMENTS

First Preferred Embodiment

Figure 3:
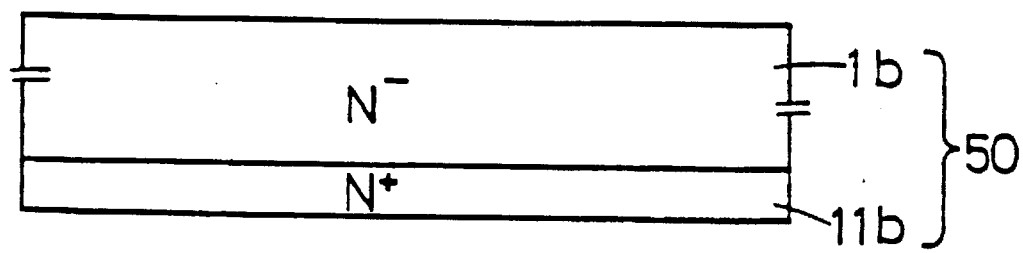
FIG. 3 shows a lower bonding material of the first preferred embodiment.

Description will be given hereinafter on a first preferred embodiment according to the present invention. FIGS. 1 to 12 are cross-sectional views showing a method of producing a power IC in order of procedure according to the present invention. Reference numerals and characters 1a, 1b, 6, 7, 11b, 20 designate identical or corresponding parts of the prior art technique.

Initially, the surface of a single-crystal Si substrate 1a shown in FIG. 1 is oxidized to provide oxide films 20, 21 as shown in FIG. 2, so that an upper bonding material 40 is constructed.

As shown in FIG. 3, a lower bonding material 50 includes a single-crystal Si substrate 1b and an $N^+$ region 11b which is formed by diffusing impurities at high concentration on the bottom surface of the single-crystal Si substrate 1b. The surface impurity concentration and thickness of the substrate 1b are designed in accordance with the breakdown voltage and the like of a power device formed later. For example, when a breakdown voltage of 1000 V is required, a thickness of about 70 μm and a surface impurity concentration of about $10^{14}$ cm$^{-3}$ are selected.

Figure 4:
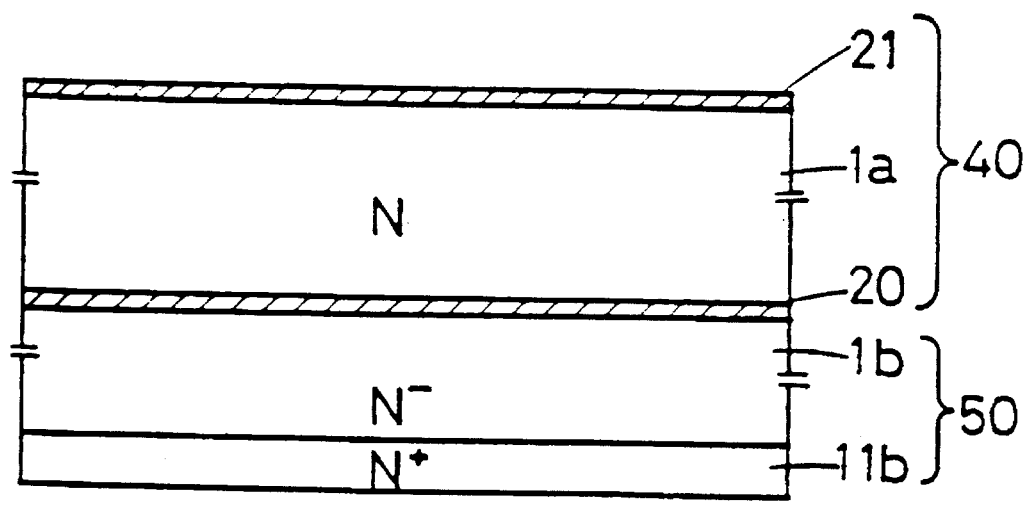
FIG. 4 shows the step of bonding the upper bonding material of FIG. 2 and the lower bonding material of FIG. 3.

The upper and lower bonding materials 40 and 50 are bonded through the oxide film 20 by means of a known bonding technique (FIG. 4).

Figure 5:
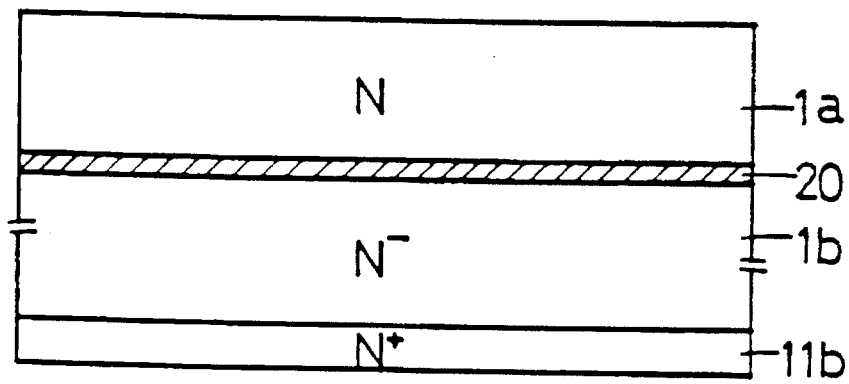
FIG. 5 shows the step of removing an oxide film on the top surface of the upper bonding material of FIG. 4.

The single-crystal Si substrate 1a is cut and ground from the top surface of the upper bonding material 40 until the single-crystal Si substrate 1a remains with a thickness (about 2 to 5 μm) required for drive and logic circuits formed later, so that an SOI substrate is provided (FIG. 5).

Figure 6:
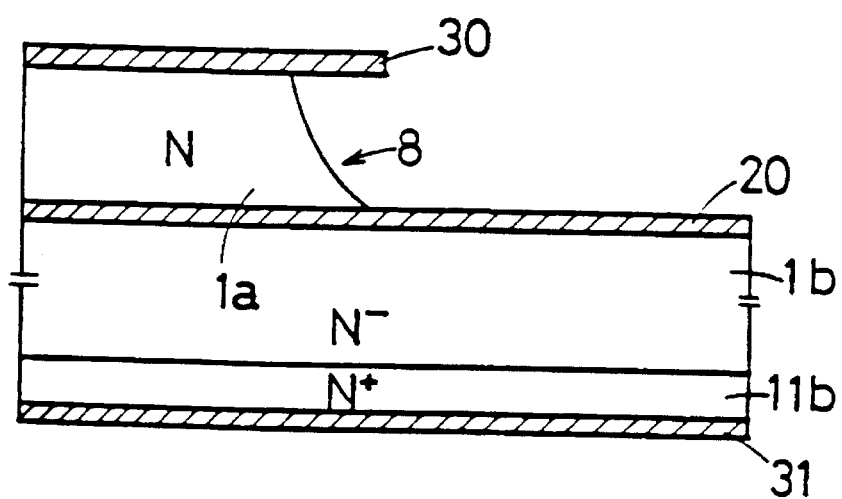
FIG. 6 shows the step of selectively removing the single-crystal silicon of the upper bonding material of FIG. 5.
Figure 7:
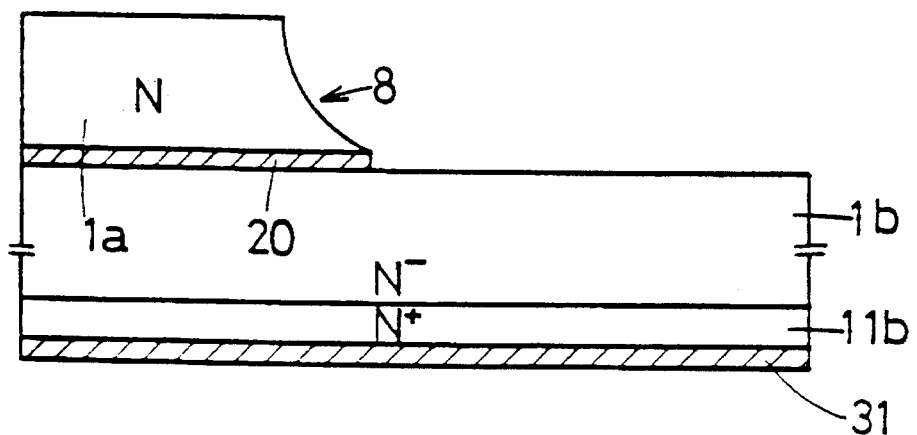
FIG. 7 shows the step of selectively removing an oxide film on the bottom surface of the upper bonding material of FIG. 6.
Figure 8:
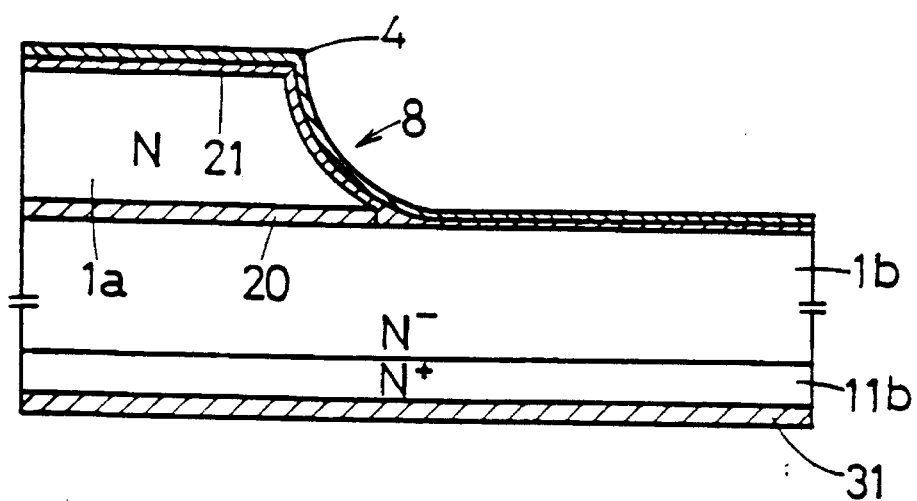
FIG. 8 shows the step of forming oxide and nitride films over the top surface of a structure shown in FIG. 7.

An oxide film 30 is formed on the substrate 1a and is selectively etched away masked with resist. After the etching, the substrate 1a is selectively etched away masked with the remaining oxide film 30 to form a stepped wall surface 8 (FIG. 6). Subsequently, the oxide film 30 is entirely removed. Part of the oxide film 20 which is not covered with the substrate 1a but is exposed is also removed (FIG. 7).

Figure 9:
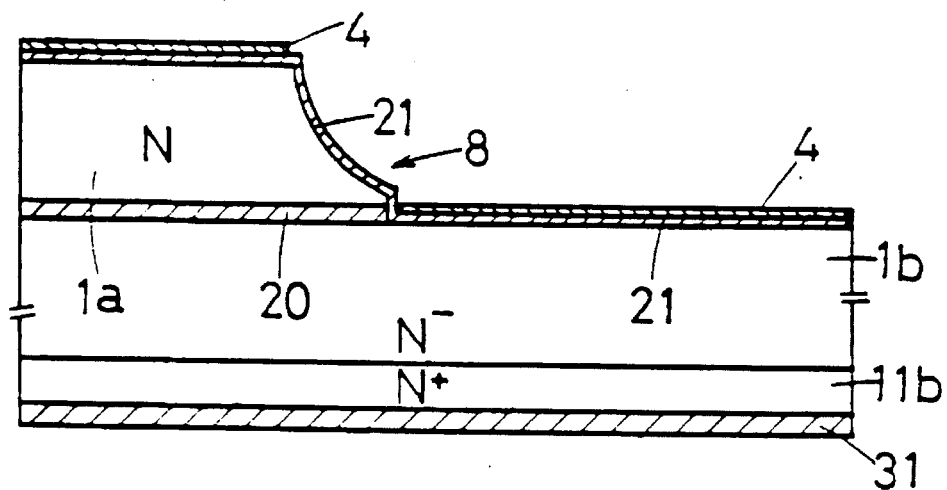
FIG. 9 shows the step of selectively removing the nitride film of FIG. 8.
Figure 10:
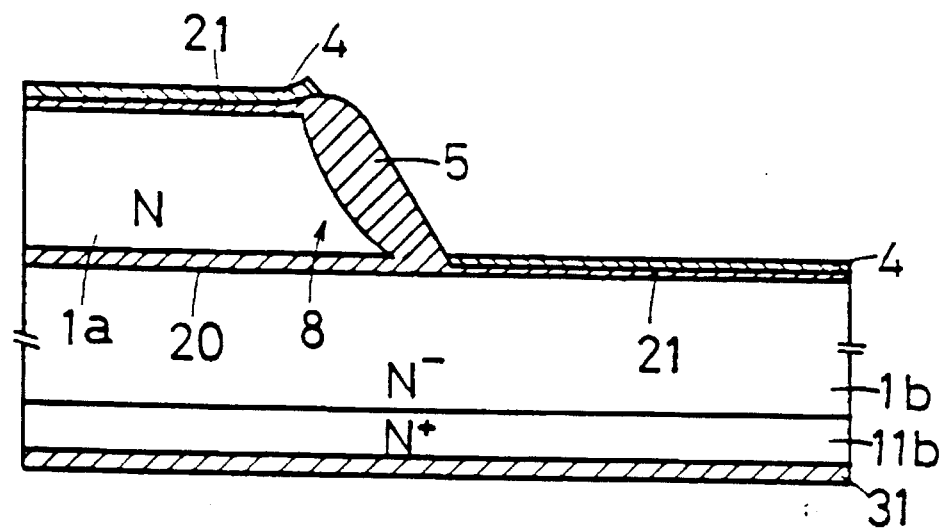
FIG. 10 shows the step of increasing the thickness of the oxide film on a stepped wall surface of FIG. 9.

Thin oxide and nitride films 21 and 4 are formed over the top surface (FIG. 8), and part of the nitride film 4 which lies on the stepped wall surface 8 of the substrate 1a is removed (FIG. 9). The thickness of the oxide film 21 on the stepped wall surface 8 of the substrate 1a is increased by oxidation to form a 1 to 2 μm thick oxide film 5 (FIG. 10).

Figure 11:
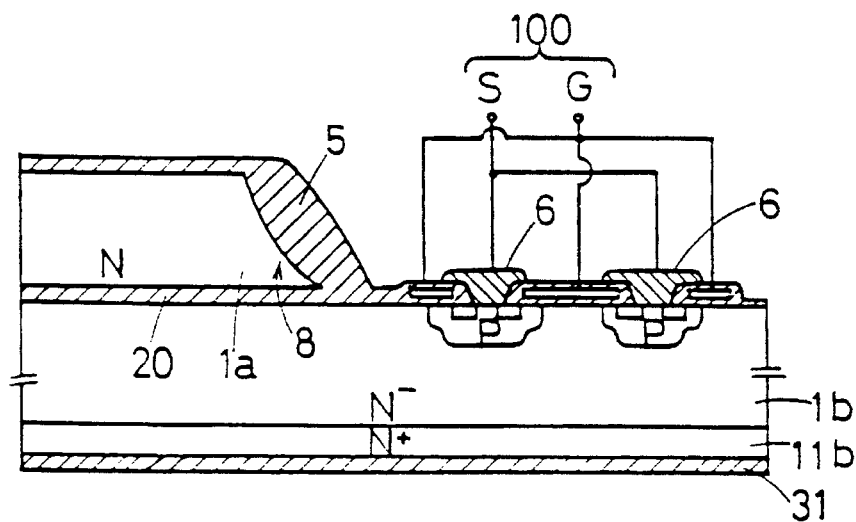
FIG. 11 shows the step of forming a power device in an active region of FIG. 10.
Figure 12:
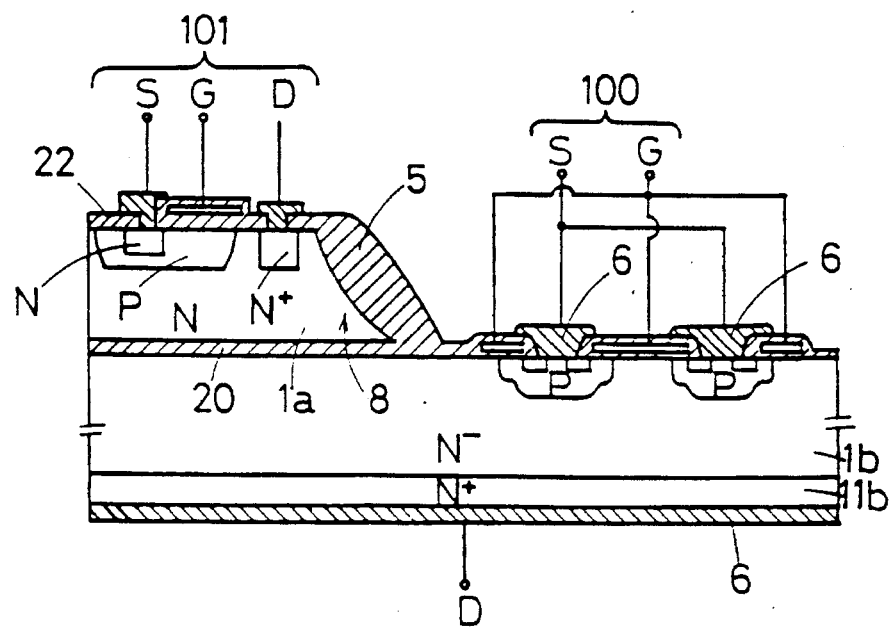
FIG. 12 shows the step of forming a logic circuit in the upper bonding material of FIG. 11.

The nitride film 4 is removed. A power device, e.g., VDMOS 100 is formed in an active region of the substrate 1b above which the substrate 1a is absent (FIG. 11). In the substrate 1a are formed a logic circuit, e.g., MOS 101 which has a thin oxide film 22 of about 0.1 to 0.2 μm in thickness and a drive circuit (not shown) as shown in FIG. 12.

Figure 15:
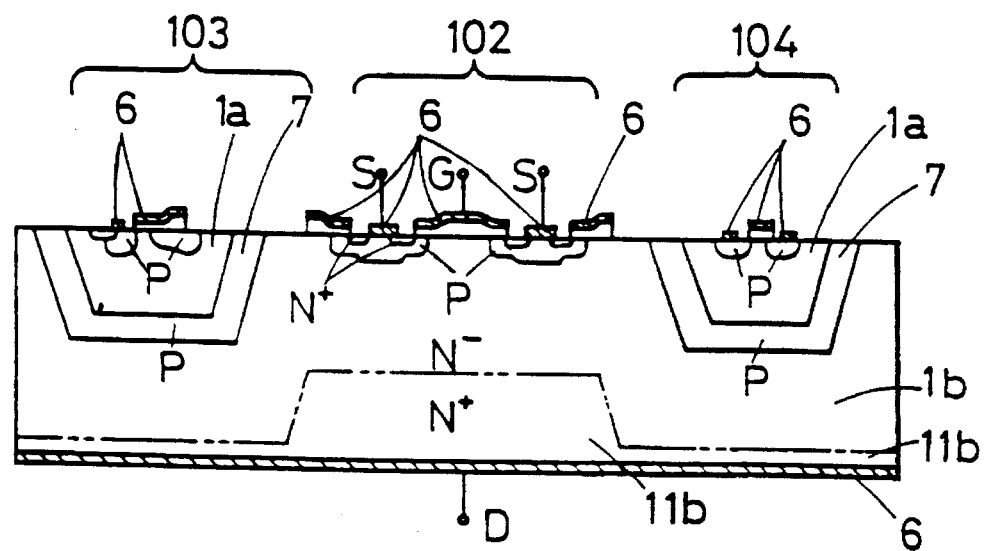
FIG. 15 is a cross-sectional view of a conventional power IC in accordance with junction isolation technique.
Figure 16:
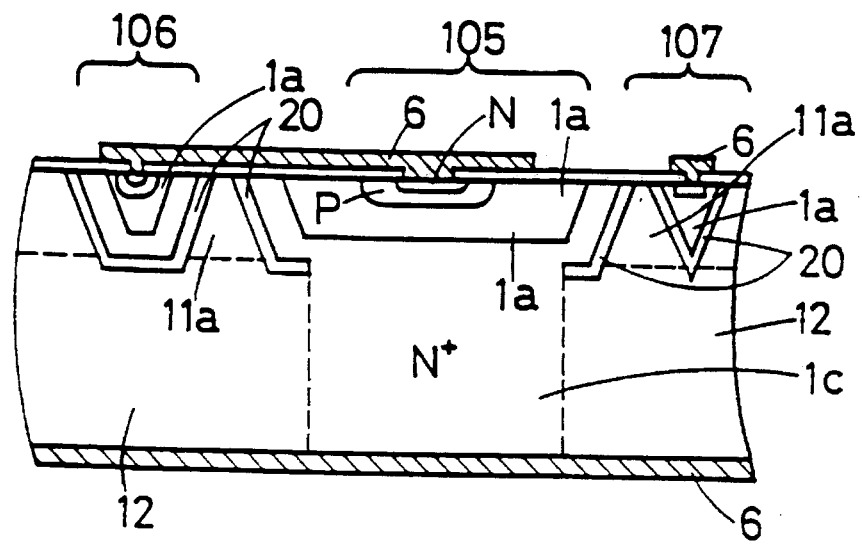
FIG. 16 is a cross-sectional view of a conventional power IC in accordance with dielectric isolation technique.

The power IC thus produced is formed with the drive and logic circuits and the vertical power device completely independently in the upper and lower single-crystal substrates 1a and 1b, respectively. The design of the circuits and device is permitted independently. The single-crystal Si substrate 1b lies on the entire bottom surface of the VDMOS 100 serving as a power device similarly to the prior art of FIG. 15. This provides for a widely reduced thermal resistance and a large current flow. Unlike the prior art shown in FIG. 16, no epitaxial growth layer is used in this preferred embodiment, so that the problem of deterioration in breakdown voltage due to its inner defects does not occur. An increased breakdown voltage is achieved by the appropriate selection of the surface impurity concentration and thickness of the substrate 1b. The thickness and impurity concentration of a region for forming therein the drive circuit and the like are not dependent on the design of the power device but can be designed independently. Since the oxide film 5 is formed thick as compared with the oxide film 22, insulation failures by damage to the oxide film 5 are prevented when the logic circuit 101 of FIG. 12 is formed.

Second Preferred Embodiment

Figure 13:
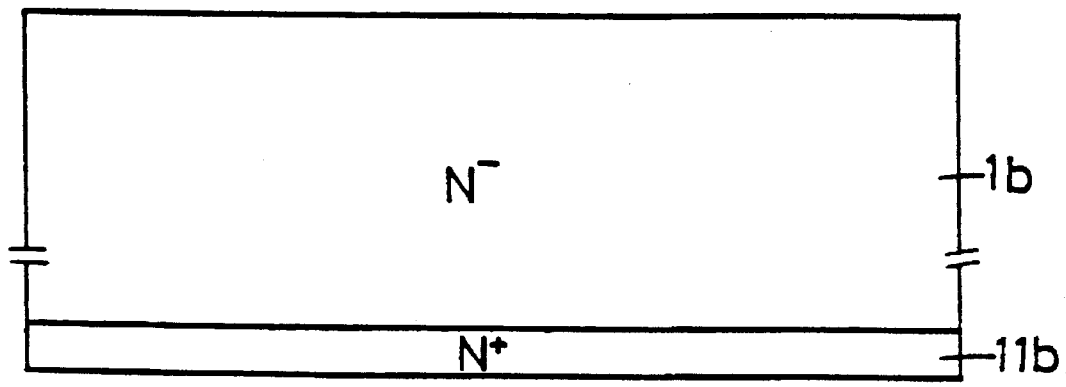
FIG. 13 shows a silicon substrate of a second preferred embodiment according to the present invention.
Figure 14:
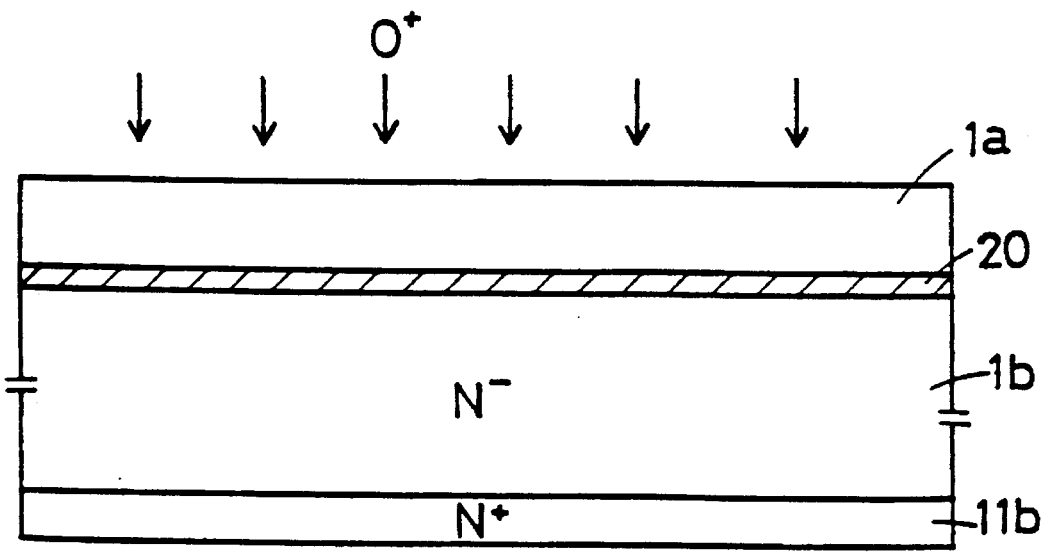
FIG. 14 shows the step of implanting oxygen ions into the silicon substrate of FIG. 13.

FIGS. 13 and 14 show a second preferred embodiment according to the present invention. As shown in FIG. 13, impurities of high concentration are diffused on the bottom surface of the single-crystal Si substrate 1b to form the N+ region 11b. This provides a structure similar to the lower bonding material 50 of FIG. 3. SIMOX technique is carried out by implantation with oxygen ions at high energy from the surface opposite to the N+region 11b, so that the relatively thin single-crystal layer 1a and oxide film 20 are formed on the substrate 1b. The single-crystal layer 1a is made with the thickness of about 2 to 5 μm by annealing after ion implantation. However, since the power device is not formed in this portion, the thickness of the single-crystal layer 1a may be increased by epitaxial growth, if necessary. Thereafter the execution of similar steps of FIGS. 6 to 12 provides for the power IC according to the present invention. According to the second preferred embodiment, the thickness of the single-crystal layer 1a is controlled by an acceleration voltage in oxygen ion implantation. The second preferred embodiment, although it is necessary to adjust the impurity concentration of the single-crystal layer 1a by another diffusion of impurities, has the advantage of considerably simple processes for production as compared with the first preferred embodiment.

While the invention has been shown and described in detail, the foregoing description is in all aspects illustrative and not restrictive. It is therefore understood that numerous modifications and variations can be devised without departing from the scope of the invention.

What is claimed is:

1. A method of producing a semiconductor device, comprising the steps of:

(a) preparing a first single-crystal layer having a first major surface which is divided into first and second regions and a second major surface, and providing a first insulative layer at least on said first region, and providing a second single-crystal layer selectively above said first region through said first insulative layer, said second single-crystal layer having a stepped wall surface above a boundary between said first and second regions;

(b) providing an insulative wall on said stepped wall surface;

(c) providing a vertical power device in said second region; and (d) providing in said second single-crystal layer a peripheral circuit having a second insulative layer thinner than said insulative wall.

2. The method of claim 1, wherein said step (a) includes the step of:

(a-1) introducing impurities to form a third single-crystal layer on said second major surface.

3. The method of claim 1, wherein said step (a) includes the steps of:

(a-2) forming said second single-crystal layer over said first insulative layer; and (a-3) selectively removing said second single-crystal layer to form said stepped wall surface.

4. The method of claim 3, wherein said step (a-2) includes the steps of:

(a-4) preparing said second single-crystal layer having first and second major surfaces;

(a-5) forming a first oxide film on said first major surface of said second single-crystal layer; and (a-6) bonding said second single-crystal layer to said first major surface of said first single-crystal layer through said first oxide film.

5. The method of claim 4, wherein said step (a-5) includes the step of (a-7) forming a second oxide film on said second major surface of said second single-crystal layer, and said step (a-6) includes the step of (a-8) removing said second oxide film.

6. The method of claim 3, wherein said step (a) includes the step of (a-9) selectively removing said first oxide film to form at least part of said first insulative layer on said first region.

7. The method of claim 1, wherein said step (b) includes the steps of:

(b-1) forming an oxide film over a structure provided by said step (a); and (b-2) increasing a thickness of part of said oxide film which is formed on said stepped wall surface.

8. The method of claim 7, wherein said step (b-2) includes the steps of:

(b-3) forming a nitride film over said oxide film;

(b-4) selectively removing part of said nitride film which lies on said stepped wall surface; and (b-5) oxidizing a structure provided by said steps (b-1) to (b-4).

9. The method of claim 1, wherein said step (a) includes the steps of:

(a-10) preparing a third single-crystal layer having first and second major surfaces; and (a-11) conducting oxygen ion implantation on said third single-crystal layer to form an oxide film which forms at least said first insulative layer, said oxide film separating said third single-crystal layer into a fourth single-crystal layer exposed on a side of said first major surface of said third single-crystal layer and a fifth single-crystal layer exposed on a side of said second major surface of said third single-crystal layer, and said fourth and fifth single-crystal layers being in corresponding relation to said second and first single-crystal layers respectively.

10. The method of claim 9, wherein said implantation is carried out from a side of said first major surface of said third single-crystal layer.

11. The method of claim 9, wherein said third single-crystal layer has a sixth layer on said second major surface of said third single-crystal.

12. The method of claim 1, wherein said vertical power device is a vertical double-diffused MOS transistor.

13. The method of claim 12, further comprising the step of forming a drain electrode of said vertical double-diffused MOS transistor on said third single-crystal layer.

14. The method of claim 1, wherein said peripheral circuit is an MOS transistor.

* * * * *